United States Patent [19]

Wellman et al.

[11] Patent Number: 4,885,463

[45] Date of Patent: Dec. 5, 1989

[54] METHOD AND APPARATUS FOR TESTING INFRARED DETECTORS

[75] Inventors: William H. Wellman, Goleta; John E. Stannard, Santa Barbara, both of Calif.

[73] Assignee: Santa Barbara Research Center, Goleta, Calif.

[21] Appl. No.: 237,911

[22] Filed: Aug. 29, 1988

[51] Int. Cl.$^4$ .......................... G01D 18/00; G01J 1/00
[52] U.S. Cl. .................................. 250/252.1; 250/351; 250/352
[58] Field of Search ................. 250/252.1 R, 252.1 A, 250/338.1, 351, 352; 374/1, 2

[56] References Cited

U.S. PATENT DOCUMENTS 4,358,679 11/1982 Lipoma ........................ 250/252.1 A
4,419,692 12/1983 Modisette et al. .................. 250/332

Primary Examiner—Janice A. Howell
Assistant Examiner—T. Nguyen
Attorney, Agent, or Firm—W. C. Schubert; W. K. Denson-Low

[57] ABSTRACT

Two broad blackbody sources (24, 26) having a constantly maintained temperature differential therebetween are alternately directed via a chopper (40) onto a detector array (12) for testing same.

20 Claims, 2 Drawing Sheets

METHOD AND APPARATUS FOR TESTING INFRARED DETECTORS

BACKGROUND

1. Technical Field

This invention relates to testing techniques and, more particularly, to a method and apparatus for testing infrared detectors.

2. Discussion

Infrared detectors are often used in conjunction with missiles and night vision systems to sense the presence of electromagnetic radiation having wavelengths in the range of about 1-15 micrometers. Mercury-cadmium-telluride or indium antimonide detector arrays are often utilized and they are generally mounted in a cryogenically cooled dewar that cools the arrays to a temperature of around 77° K. where they are most sensitive. Silicon or germanium detectors often are used at lower temperatures, 15° K. to 25° K., or even colder. Infrared detectors of this type are well known in the art and need not be discussed in detail herein since the present application is directed to the testing of these detectors and not their manufacture.

FIG. 1 illustrates a prior art method of testing an infrared detector 10 having a detector array 12 mounted within a dewar 14. A blackbody source of infrared radiation is generally designated by the reference numeral 16. The blackbody 16 is typically heated to around 500° K. so that it irradiates radiation have a wavelength in the infrared spectrum of interest, here, some portion of the band of 1-15 micrometers. The radiation from source 16 is typically concentrated by a water cooled aperture 18 having a given aperture size; this may be water-cooled to maintain the desired near-ambient temperature needed for it to correctly restrict the subtense of the hot radiator (the radiation source). Details of conventional blackbody designs are disclosed in R. D. Hudson, *Infrared System Engineering* (John Wiley & Sons, 1969), which is hereby incorporated by reference. The resulting beam 20 of radiation is directed to the detector array 12. The beam 20 is periodically blocked by a spoked wheel or other shutter-type chopper 22 which modulates the beam 20 by alternatively blocking and then passing the beam from the source 16 to the detector array 12. This modulated beam is used as a test pattern where the output of the detector array 12 is measured and compared against expectant results. Usually, the fundamental sinusoidal component of the harmonically distorted detector waveform is measured, then adjusted by a waveform factor to derive the desired peak waveform amplitude expressing detector response to the source. Then, trim components are utilized to optimize the response of the array 12.

While this standard test procedure has met the test of time, it does have some drawbacks. In general, it would be more advantageous to be able to test the detectors under conditions which more closely represent the conditions in which the detector will actually be used. However, the necessity of heating the blackbody source to 500° K. does not lend itself to accomplishing this goal since the detector generally will be used at room temperature, about 300° K. Accordingly, the test data may not simulate actual operating conditions. In addition, the prior art technique utilizes a relatively small aperture size (typically on the order of 0.25 to 1.0 inch) for restricting the beam from the high temperature blackbody source. This is necessary to avoid unwanted radiative heating of objects near the source, and to avoid undue radiative cooling of the source due to excessive escape of heat. That is, the aperture contains the heat within the blackbody. The aperture size serves as an adjustment of signal level, inasmuch as temperatures usually are standardized, e.g., at 500° K. The small aperture size results in a narrow cone of test radiation (about f/10-f/20) which is a relatively poor match to the broad cone (e.g., f/5.0 to f/1.0) usually provided by the system optics of typical infrared detectors. As a result, further errors via angular sensitivities of the filters and detectors can be introduced.

When the detector array has a wide field of view it is typically necessary to reposition the detectors during the test, again due to the relatively narrow cone of the test radiation. For best sensitivity, so-called background-limited infrared systems often are designed so that their optics produce a small exit pupil that is matched to detector cold shield, such that only rays contributing to imaging reach the detector; rays adding nonimaging or background flux are blocked. This can result in widely differing angles of incidence at different detector elements. This geometry is poorly simulated by the usual test set, which has only a narrow beam of radiation.

Source calibration is typically complicated by the enclosed nature and high operating temperature of the blackbody. Inserting thermocouples for calibration can damage the surfaces, while visual inspection, cleaning and refinishing of the surfaces can be difficult.

It is the object of the present invention to solve one or more of these problems.

SUMMARY OF THE INVENTION

According to the teachings of the present invention means are provided for generating a beam of infrared radiation at substantially ambient temperature. Second means are provided for alternately generating a second beam having a predetermined differential temperature. The operation of the infrared detector can be tested by monitoring the output thereof when alternately illuminated by the two beams.

In the preferred embodiment, two broad radiative blackbody sources are employed with different optical paths, one of which is directed at the detector array. A chopper device having alternately disposed transmissive and reflective blades is used to intercept the beams. If the intercepting blade is transmissive, the first source strikes the detector array while the beam from the second source does not. On the other hand, when a reflective blade intercepts the beam, the first beam is reflected away from the detector array while the second beam is reflected onto the detector array. Both sources operate at near ambient temperatures and are maintained at a precisely controlled differential temperature.

BRIEF DESCRIPTION OF THE DRAWINGS

The various advantages of the present invention will become apparent to those skilled in the art after a study of the following specification and by reference to the drawings in which:

FIGS. 2 and 3 are schematic diagrams of testing apparatus made in accordance with the teachings of the present invention, with FIG. 2 illustrating the path of the beams when a transmissive blade intercepts them while FIG. 3 shows the beams being reflected along different paths when a reflective blade intercepts the beams.

DESCRIPTION OF THE PREFERRED EMBODIMENT

Figure 2:
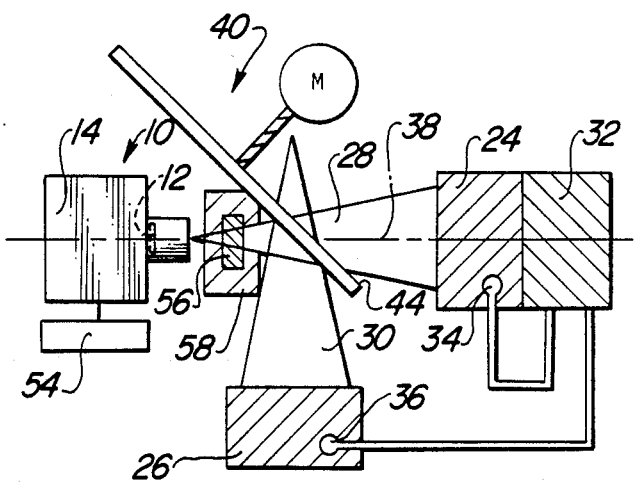
Figure 3:
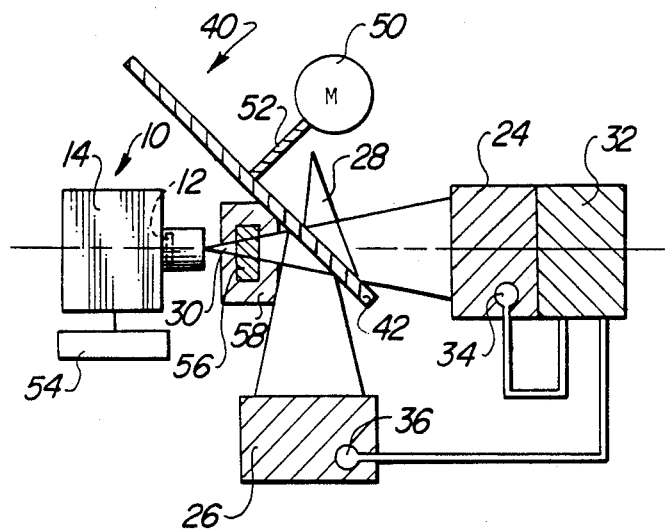

Turning now to FIGS. 2-3, a pair of broad radiative blackbody sources 24 and 26 are employed to generate broad beams 28 and 30, respectively, of infrared radiation having a wavelength of between 1-15 micrometers. For purposes of this invention, the terms "broad" blackbody source or beam means that the radiation therefrom completely fills the field of view of the detector array 12, as compared with the prior art approach where the narrow cone of radiation from the heated blackbody only partially fills the field of view. Blackbody sources 24 and 26 are maintained at an accurate temperature differential by a thermal control unit 32. The sources 24, 26 and control unit 32 can be adapted from a commercially available differential blackbody. Such units customarily place a screen grid directly in front of a background panel in order to create a controlled thermal bar-pattern that is used for quantitative tests of optical system response. In the preferred embodiment, this panel is modified so that the screen grid is made as a solid panel without the usual bar-pattern cutout and this panel is relocated so that it is no longer placed directly in front of the temperature-control emitter or source. The background panel serves as the blackbody source 24 shown in FIG. 2 and the modified panel serves as the relocated source 26. The temperature control unit operates to maintain a precise temperature differential between the sources 24 and 26. The desired temperature differential is typically maintained by using thermoelectric junctions 34 and 36 that are powered with positive or negative current flow from controller 32 to achieve heating or cooling as required to achieve the desired temperature differential.

The blackbody sources 24 and 26 are each maintained at a temperature of below 400° Kelvin, and, more preferably, at about 300° Kelvin or ambient temperature. The temperature differential between the two sources 24 and 26 is maintained between 4° and 400° Kelvin; preferably less than 50° Kelvin.

The detector 10 which is under test is oriented so that its optical axis 38 is generally coincident with the optical axis of the beam 28 emanating from source 24. In contrast, source 26 is located so that its beam 30 normally is not incident the detector array 12. In the particular embodiment illustrated, the optical axis of the beam 30 is substantially transverse to the optical axis 38 of the detector 10.

Provision is made for intercepting the beams 28 and 30 and redirecting their optical paths so that the beams are alternately incident the infrared detector 12. This is preferably accomplished by a rotating chopper 40 having a plurality of alternately reflective 42 and transmissive 44 blades. The blades can be made in a variety of different manners. For example, they may be made by applying a reflective film of gold or other suitable infrared reflectors to a transmissive disk. The transmissive zones of the disks preferably are surface-coated for low reflectance, either in an overall coating underlying the reflective pattern, or in a suitably delineated coating applied after the gold is applied, among other appropriate methods of fabrication. Also, the low reflection coating may be omitted, if surface reflections are low enough or consistent enough. In fact, all that is required is that the chopper have two coated zones which differ enough in reflectance so that a modulated signal of sufficient strength is generated by the detector array 12 when alternately viewing beams 28 and 30. Another possible chopper embodiment employs two different reflectances in the two zones, provided only that the reflectance and transmittance of both zones are calibrated with sufficient accuracy. Another possible embodiment consists of physical cutouts in a mirrored disk. This is similar to the commonplace spoked chopper, except that the opaque regions are reflective rather than transmissive, and the surface finish is reasonably flat so that the reflections are limited to rays emanating from the intended source, rather than including the diffusely reflected or scattered rays emanating from other objects.

Figure 4:
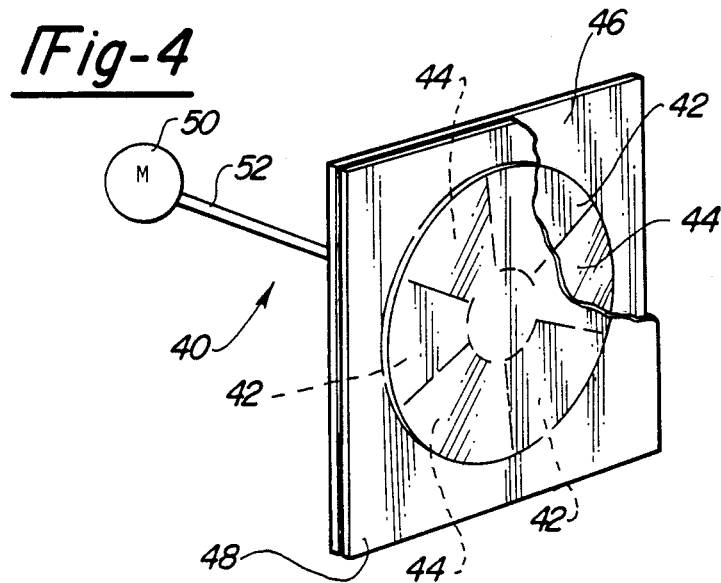
FIG. 4 is a front view of a chopper device made in accordance with the preferred embodiment of this invention illustrating the alternately disposed transmissive and reflective blades in a shroud.

As shown in FIG. 4, an optional shroud consisting of two transmissive plates 46 and 48 may be used to enclose the chopper disk, both for safety reasons and to reduce convective heat transfer. This should improve temperature stability of the blackbody sources and reduce temperature variations across their faces which otherwise could result by unwanted thermal transfer created by strong convection currents.

A motor 50 is coupled to the chopper disk by way of shaft 52 and serves to rotate the chopper so that the reflective 42 and transmissive 44 blades alternately intercept the beams 28 and 30. FIG. 2 illustrates the test setup when the transmissive blade 44 intercepts the beams. At this position, the detector array 12 views the beam 28 from blackbody source 24. FIG. 3, on the other hand, illustrates the situation in which a reflective blade 42 intercepts the beams. At this position, the beam 28 is reflected away from the detector array 12 while the beam 30 is reflected onto the detector array 12. Thus, the array 12 alternately views infrared radiation at two different, but precisely controlled temperatures or wavelengths in the infrared spectrum. The modulated output of array 12 is suitably tested by appropriate test apparatus designated by the box bearing numeral 54.

If desired for added accuracy, an optional beam splitter 56 and unmodulated broad blackbody source 58 can be used. The beam splitter 56 substantially equally attenuates the radiation from sources 24 and 26. Source 58, on the other hand, substitutes unchopped or unmodulated flux for some of the chopped flux which radiates the detector array 12. This essentially dilutes the effects of the controlled temperature differential by adding equal radiation from the third broad source 58 into the radiation from both of the sources 24 and 26. For example, a 80% reflective and 20% transmissive infrared beam splitter can attenuate the temperature differential by approximately a ratio of 5:1. The exact attenuation depends upon a radiometric calculation involving temperatures of all three sources. In any event, the full detector aperture remains uniformly irradiated and the differential accuracy is preserved.

Figure 1:
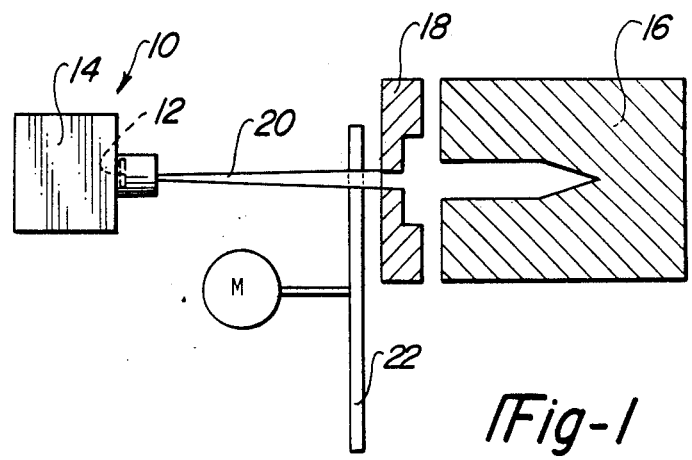
FIG. 1 is a schematic diagram of a PRIOR ART arrangement for testing infrared detectors.

The present invention has several advantages over the traditional testing procedure and apparatus. One of the biggest advantages is the avoidance of the complex furnace-type constructions in the conventional blackbody arrangements since the dual sources of the present invention can operate at ambient temperatures (around 300° K.) while still providing accurate test results. The test procedure more accurately simulates actual operating conditions of the detector and avoids those errors produced by operating the prior art blackbody at such high temperatures of about 500° K. The test procedure is adaptable to provide accurate simulations of scenes at other than at ambient temperatures including arctic and desert temperatures by simply heating or cooling the blackbody sources 24 or 26 as required. The use of the broad beams of irradiation as compared to the narrow beams shown in FIG. 1 obviates the need to move the detector during the test. In addition, the broad beam of infrared radiation provided by the present invention more closely matches the radiation received by the detector in actual use. Most infrared detectors include a cold stop usually located within the detector unit, while other infrared detectors employ a quasi-telecentric design which does not form a usable exit pupil. In the latter systems, a stop is usually placed in front of the detector. For these latter types of units, the method of the present invention should include an external stop to allow the test setup to simulate the detector irradiation that a true optical system would provide the detectors. In this latter case, the external stop may be moved during the test to reproduce the different pupil locations experienced by the various image points on the detectors thereby simulating the operation of systems which have such effects.

It should be understood that while this invention has been described in connection with a particular example thereof, that various modifications of the disclosed preferred embodiment can be made after having the benefit of a study of the specification, drawings and following claims.

What is claimed is:

1. Apparatus for testing an infrared detector, said apparatus comprising:
   first means for providing a beam of infrared radiation at substantially ambient temperature;
   second means for alternately providing a second beam of a predetermined differential temperature than the first beam; and
   whereby the operation of the infrared detector can be tested by monitoring the output thereof when alternately illuminated by the two beams.

2. The apparatus of claim 1 wherein said first beam is directed along a first optical path normally incident the infrared detector, and wherein said second means comprises:
   a second source of a beam of infrared radiation directed along a second optical path which is not normally incident the infrared detector; and
   means for intercepting the beams and redirecting the optical paths thereof so that the beams are alternately incident the infrared detector.

3. The apparatus of claim 2 wherein the means for intercepting comprises:
   chopper means having a plurality of rotating blades, the blades being alternatively reflective and transmissive whereby the transmissive blades fail to disturb the optical paths of the two beams while the reflective blade is oriented to block the first beam from reaching the detector while deflecting the second beam onto the detector.

4. The apparatus of claim 2 wherein the two beam sources remain at temperatures of below about 400° K.

5. The apparatus of claim 2 which further comprises:
   means for constantly maintaining a temperature differential between the two beam sources of between 4° and 400° K.

6. The apparatus of claim 2 wherein both beam sources are at less than 400° K. and have a constant temperature differential therebetween of less than 50° K.

7. The apparatus of claim 3 which further comprises:
   attenuator means adjacent the infrared detector for substantially equally attenuating the radiation from the first and second beam sources.

8. The apparatus of claim 7 wherein the attenuator means comprises a beam splitter having predetermined reflective and transmissive characteristics.

9. The apparatus of claim 8 which further comprises:
   an additional third source of infrared radiation which is incident the detector and unmodulated by the chopper means.

10. The apparatus of claim 3 wherein the chopper means comprises a transmissive disc having zones of at least partially reflective material coated thereon.

11. Apparatus for testing an infrared detector having a cryogenically cooled array mounted in a dewar, the array having a given field of view along an optical axis, said apparatus comprising:
    a first blackbody source for providing a first broad beam of infrared radiation along the optical axis towards said array;
    a second blackbody source for providing a second broad beam of infrared radiation directed at an angle relative to the optical axis so that said second beam is not normally incident the array;
    temperature control means connected between the first and second blackbody sources for maintaining a constant temperature differential therebetween and for maintaining both sources at a temperature below 400° Kelvin; and
    means for intercepting the beams and redirecting them so that the first and second beams are alternately incident the array.

12. The apparatus of claim 11 wherein the means for intercepting comprises:
    chopper means having a plurality of rotating blades.

13. The apparatus of claim 12 wherein said chopper means comprises a transmissive disk having a plurality of alternately disposed zones of reflective material thereon.

14. The apparatus of claim 11 wherein the temperature differential between the two blackbody sources is between 4° and 400° Kelvin.

15. The apparatus of claim wherein the temperature differential between the two blackbody sources is less than 50° K.

16. The apparatus of claim 12 which further comprises:
    attenuator means adjacent the infrared detector for substantially equally attenuating the radiation from the first and second blackbody sources.

17. The apparatus of claim 16 wherein the attenuator means comprises a beam splitter having predetermined reflective and transmissive characteristics.

18. The apparatus of claim 17 which further comprises:
    a third blackbody source of infrared radiation disposed between the chopper means and the detector array, adapted to provide a substantially constant source of infrared radiation in addition to the alternately presented first and second beams.

19. The apparatus of claim 18 which further comprises:
    shroud means surrounding the chopper means for minimizing convection heating created by the rotating blades.

20. The apparatus of claim 19 wherein the shroud means comprises a pair of transmissive plates disposed on opposite sides of the chopper disk.

* * * * *